us008081409B2

United States Patent
Wu

(10) Patent No.: US 8,081,409 B2
(45) Date of Patent: Dec. 20, 2011

(54) EMBEDDED BRIDGE RECTIFIER INTEGRATED WITH CONFIGURABLE I/O PADS

(75) Inventor: Po-Hao Wu, Hsin Chu County (TW)

(73) Assignee: Elan Microelectronics Corp., Hsin-Chu (TW)

( * ) Notice: Subject to any disclaimer, the term of this patent is extended or adjusted under 35 U.S.C. 154(b) by 399 days.

(21) Appl. No.: 12/483,097

(22) Filed: Jun. 11, 2009

(65) Prior Publication Data
US 2009/0316456 A1    Dec. 24, 2009

(30) Foreign Application Priority Data
Jun. 24, 2008  (TW) ................................ 97123439 A

(51) Int. Cl.
*H02H 9/00*   (2006.01)

(52) U.S. Cl. .......................... 361/56; 361/91.5; 257/355

(58) Field of Classification Search ................... 361/56, 361/91, 119, 58, 111, 91.5; 257/355–360, 257/363, 724, 764–765; 327/325, 326; 323/282, 323/315
See application file for complete search history.

(56) References Cited

U.S. PATENT DOCUMENTS

| | | | | |
|---|---|---|---|---|
| 5,530,612 A * | 6/1996 | Maloney | ........................ | 361/56 |
| 5,610,790 A * | 3/1997 | Staab et al. | ..................... | 361/56 |
| 5,946,175 A * | 8/1999 | Yu | ................................... | 361/56 |
| 6,064,093 A * | 5/2000 | Ohta | ............................. | 257/355 |
| 6,396,137 B1 * | 5/2002 | Klughart | ..................... | 257/691 |
| 7,889,470 B2 * | 2/2011 | Ker et al. | ........................ | 361/56 |

* cited by examiner

*Primary Examiner* — Rajnikant Patel
(74) *Attorney, Agent, or Firm* — Muncy, Geissler, Olds & Lowe, PLLC

(57) ABSTRACT

An embedded bridge rectifier is disclosed. By reconfiguring and reconnecting internal ESD protection circuits originally installed at two bonding pads of integrated circuits, the invention not only saves hardware cost of conventional external bridge rectifiers, but also reduces the space of print circuit boards.

18 Claims, 7 Drawing Sheets

US 8,081,409 B2

EMBEDDED BRIDGE RECTIFIER INTEGRATED WITH CONFIGURABLE I/O PADS

This application claims the benefit of the filing date of Taiwan Application Ser. No. 097123439, filed on Jun. 24, 2008, the content of which is incorporated herein by reference.

BACKGROUND OF THE INVENTION

1. Field of the Invention

The invention relates to semiconductor devices, particularly to a bridge rectifier embedded in an integrated circuit (IC), into which internal pads and an external bridge rectifier are integrated.

2. Description of the Related Art

In addition to detecting radio signals, rectifiers are used to convert alternating current (AC) signals into direct current (DC) signals, especially converting AC power into DC power. FIG. 1 is a circuit diagram of a conventional bridge rectifier located outside an IC. Referring FIG. 1, a conventional bridge rectifier 100, located outside an IC 120, has four diodes $D_1$, $D_2$, $D_3$ and $D_4$ connected in a bridge arrangement to achieve full-wave rectification. A feature of the bridge rectifier 100 is that for both polarities of the input voltage ($V_{in1}$ with respect to $V_{in2}$), the polarity of the output voltage (VPX with respect to GND) is always constant. For example, when the voltage $V_{in1}$ is positive with respect to the voltage $V_{in2}$, two diodes $D_1$ and $D_3$ are forward biased and then current flows along the path La. When the voltage $V_{in1}$ is negative with respect to the voltage $V_{in2}$, two diodes $D_2$ and $D_4$ are forward biased and then current flows along the path Lb. As can be observed from the current paths La and Lb, the current flow through a load 120 is always in the same direction.

It is desirable to reduce hardware cost of conventional external bridge rectifiers. The invention addresses such a need.

SUMMARY OF THE INVENTION

In view of the above-mentioned problems, an object of the invention is to provide an embedded bridge rectifier, which reconfigures internal electrostatic discharge (ESD) protection circuits originally installed inside an IC, thereby saving the hardware cost of conventional external bridge rectifiers and reducing the space of print circuit boards, without adding additional components into the interior of the IC.

To achieve the above-mentioned object, the embedded bridge rectifier, applied to the interior of an integrated circuit, for receiving an input alternating current (AC) signal and generating an output direct current (DC) signal, comprising: a first PMOS transistor, the gate and the source of the first PMOS transistor being shorted together; a first NMOS transistor, the gate and the source of the first NMOS transistor being shorted together, wherein the drains of the first NMOS transistor and the first PMOS transistor are connected at a first pad of the integrated circuit; a second PMOS transistor, the gate and the source of the second PMOS transistor being shorted together, wherein the sources of the first PMOS transistor and the second PMOS transistor are connected at a first output node of the integrated circuit; and, a second NMOS transistor, the gate and the source of the second NMOS transistor being shorted together, wherein the drains of the second NMOS transistor and the second PMOS transistor are connected at a second pad of the integrated circuit and the sources of the first NMOS transistor and the second NMOS transistor are connected at a second output node of the integrated circuit; wherein the input AC signal is applied to the first pad and the second pad and the output DC signal is generated between the first output node and the second output node, and wherein the voltage of the first output node is greater than that of the second output node.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 2:
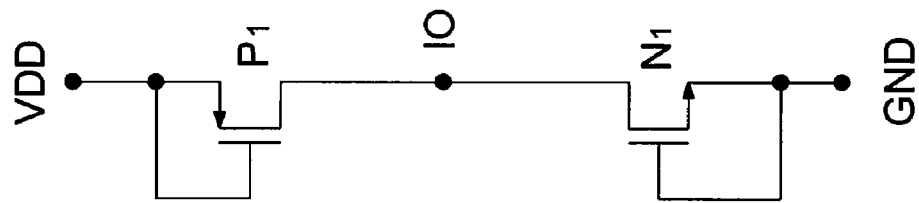
FIG. 2 is a circuit diagram of a conventional internal ESD protection circuit installed at a bonding pad IO.

FIG. 2 is a circuit diagram of a conventional internal ESD protection circuit installed at a bonding pad IO. ESD protection circuits are used to offer ESD protection in general ICs. When an ESD event occurs, the ESD protection circuit diverts a potentially damaging charge away from internal circuitry and protects the IC from permanent damage. Referring FIG. 2, as can be observed from the conventional ESD protection circuit originally installed near the bonding pad IO, the gate and the source of a PMOS transistor $P_1$ are shorted together and the gate and the source of a NMOS transistor $N_1$ are shorted together. Both transistors $P_1$ and $N_1$ are substantially equivalent to two diodes connected in series.

Figure 1:
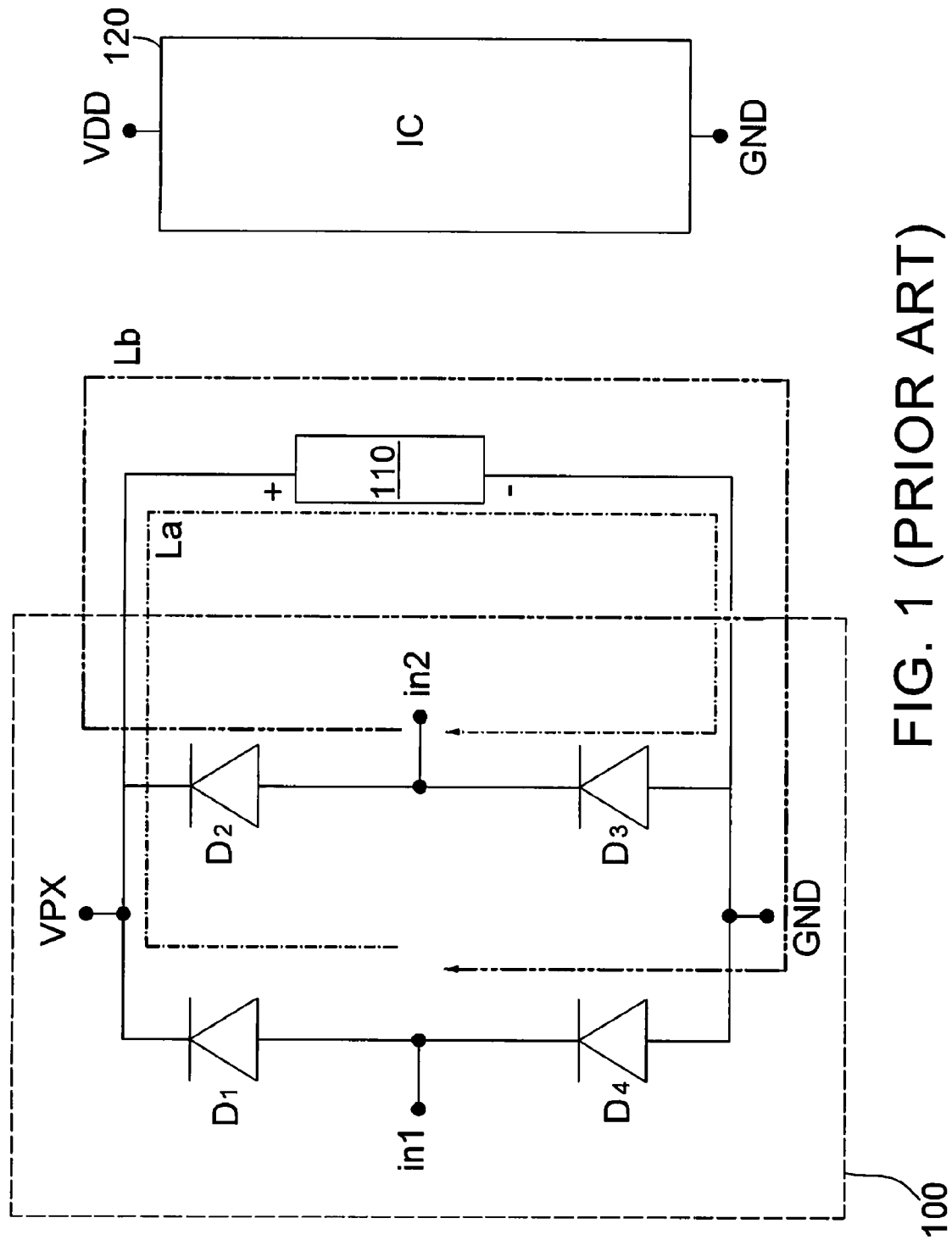
FIG. 1 is a circuit diagram of a conventional bridge rectifier located outside an IC.
Figure 3:
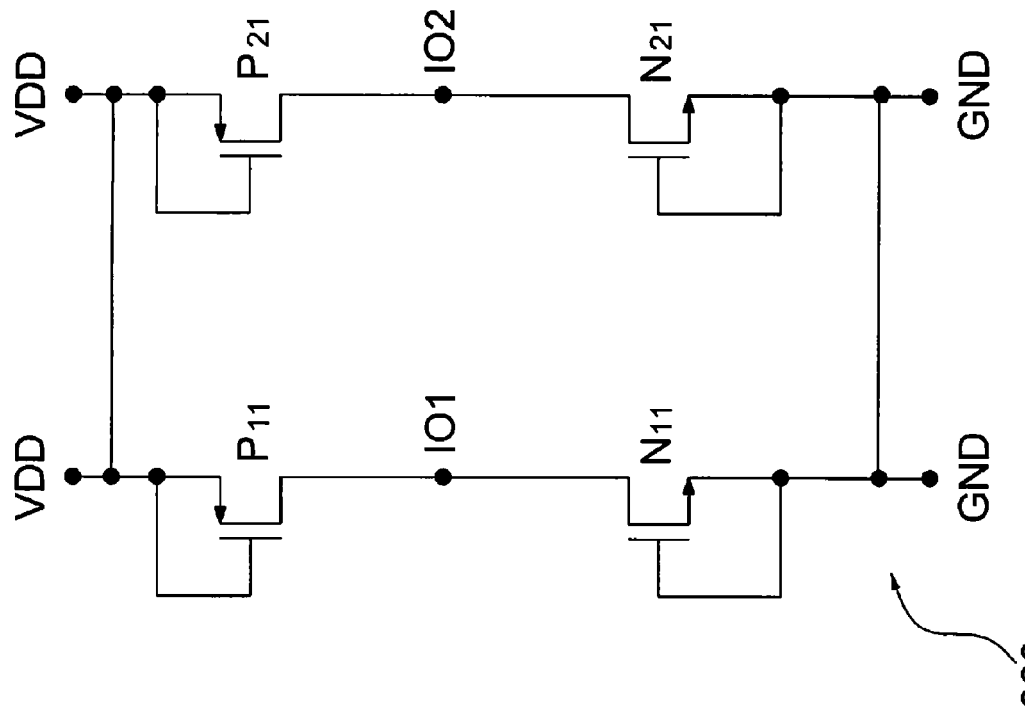
FIG. 3 is a circuit diagram of an embedded bridge rectifier according to a first embodiment of the invention.

FIG. 3 is a circuit diagram of an embedded bridge rectifier according to a first embodiment of the invention. As shown in FIG. 3, an internal ESD protection circuit originally installed at a bonding pad IO1 includes a PMOS transistor $P_{11}$ and a NMOS transistor $N_{11}$; another internal ESD protection circuit originally installed at a bonding pad IO2 includes a PMOS transistor $P_{21}$ and a NMOS transistor $N_{21}$. According to the invention, the two ESD protection circuits originally installed at two bonding pads IO1 and IO2 are reconfigured and reconnected. That is, the sources of the PMOS transistors $P_{21}$ and $P_{11}$ are shorted together and the sources of the NMOS transistors $N_{21}$ and $N_{11}$ are shorted together. Consequently, an embedded bridge rectifier 300 of the invention is formed. Comparing FIGS. 1 and 3, the PMOS transistor $P_{11}$ is equivalent to the diode $D_1$; the PMOS transistor $P_{21}$ is equivalent to the diode $D_2$; the NMOS transistor $N_{11}$ is equivalent to the diode $D_4$; the NMOS transistor $N_{21}$ is equivalent to the diode $D_3$. Thus, an input signal that is originally applied to two input terminals of the conventional bridge rectifier 100 can be directly fed into the IC (the two bonding pads IO1 and IO2) instead. In comparison to conventional external bridge rectifiers, conventional external components are allowed to be discarded and the hardware cost and the space of the printed circuit board are saved in the first embodiment of the invention. Certainly, the output rectified voltage VDD of the embedded bridge rectifier 300 can directly or indirectly serve as a power supply for the use of the IC. For example, the output rectified voltage VDD can be reduced by a regulator to a desired voltage level VDDL for use.

It should be noted that the embedded bridge rectifier of the invention making use of the bonding pads and the ESD protection circuits do not conflict with the common input/output signal applications. The reasons are as follows. First, when the bonding pads and the ESD protection circuits used in the embedded bridge rectifier of the invention, the voltage VDD is not connected to any power supply, but receives the AC signal or the AC power fed into the two bonding pads IO1 and IO2 instead; in contrast, in the common input/output signal applications, the voltage VDD needs to be connected to a power supply. Secondly, in the embedded bridge rectifier of the invention, one of the voltages at the bonding pads IO1 and IO2 has to be greater than the voltage VDD in order to turn on diodes; in contrast, in the common input/output signal applications, both the voltages at the bonding pads IO1 and IO2 are less than or equal to the voltage VDD. Thirdly, in the embedded bridge rectifier of the invention, the polarities of the voltages of the bonding pads IO1 and IO2 are reversed to each other; in contrast, in the common input/output signal applications, each polarity of two voltages at the bonding pads IO1 and IO2 depends on its own application. Accordingly, depending on functional requirements, related circuit configurations can be modified to develop various applications.

Figure 4A:
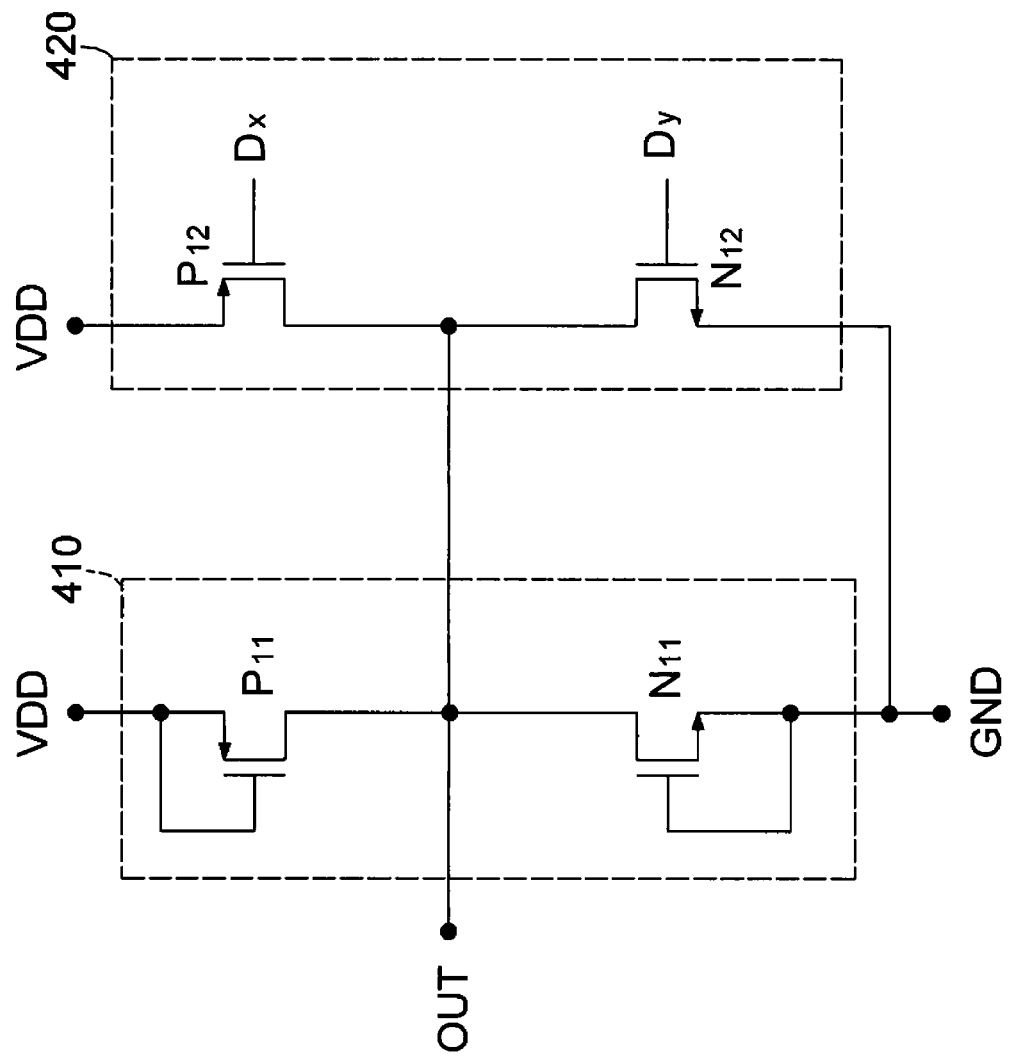
FIG. 4A is a circuit diagram of a conventional internal ESD protection circuit and a conventional internal output buffer installed at an output bonding pad OUT.
Figure 4B:
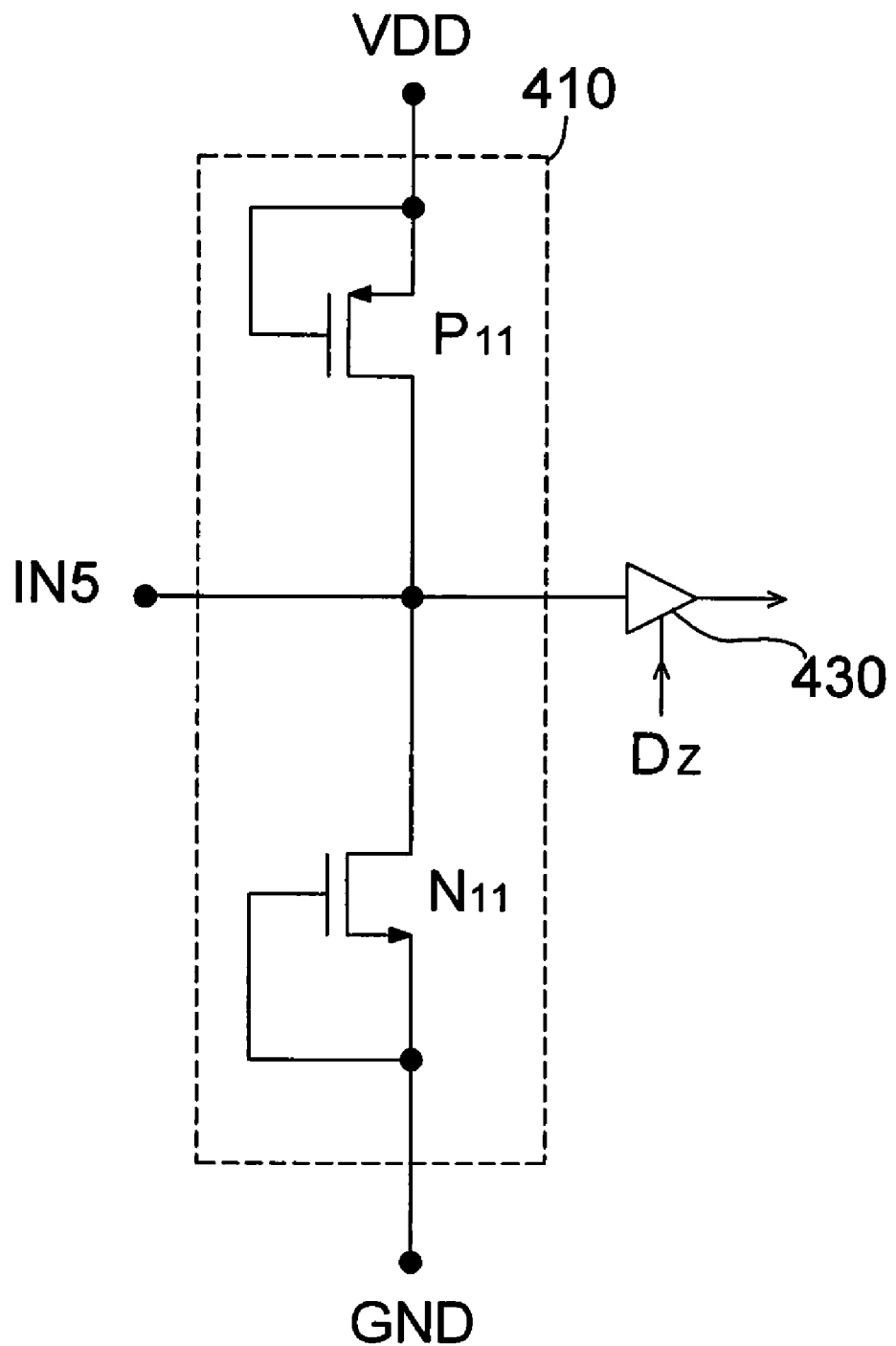
FIG. 4B is a circuit diagram of a conventional internal ESD protection circuit and a conventional internal input buffer installed at an input bonding pad IN5.

FIG. 4A is a circuit diagram of a conventional internal ESD protection circuit and a conventional internal output buffer installed at an output bonding pad OUT. Referring to FIG. 4A, an output bonding pad OUT is typically connected with an ESD protection circuit 410 and an output buffer 420. In the output buffer 420, a PMOS transistor $P_{12}$ and a NMOS transistor $N_{12}$ are responsive to two control signals Dx and Dy, respectively. When the control signal Dx is at a logic high voltage level (VDD) and the control signal Dy is at a logic low voltage level (GND) (indicating that the output buffer 420 is disabled), the operable ESD protection circuit 410 is equivalent to the circuit of FIG. 2. In other words, in connection with the embedded bridge rectifier 300 of the invention, either or both of the bonding pads IO1 and IO2 can be replaced with the output bonding pad OUT connected to its ESD protection circuit 410 and its disabled output buffer 420. FIG. 4B is a circuit diagram of a conventional internal ESD protection circuit and a conventional internal input buffer installed at an input bonding pad IN5. Referring to FIG. 4B, an input bonding pad IN5 is typically connected with an ESD protection circuit 410 and an input buffer 430. The input buffer 430 is responsive to a control signals Dz. When the control signal Dz is disabled (indicating that the input buffer 430 is also disabled), the operable ESD protection circuit 410 is equivalent to the circuit of FIG. 2. In other words, in connection with the embedded bridge rectifier 300 of the invention, either or both of the bonding pads IO1 and IO2 can be replaced with the input bonding pad IN5 connected to its ESD protection circuit 410 and its disabled input buffer 430.

Figure 5:
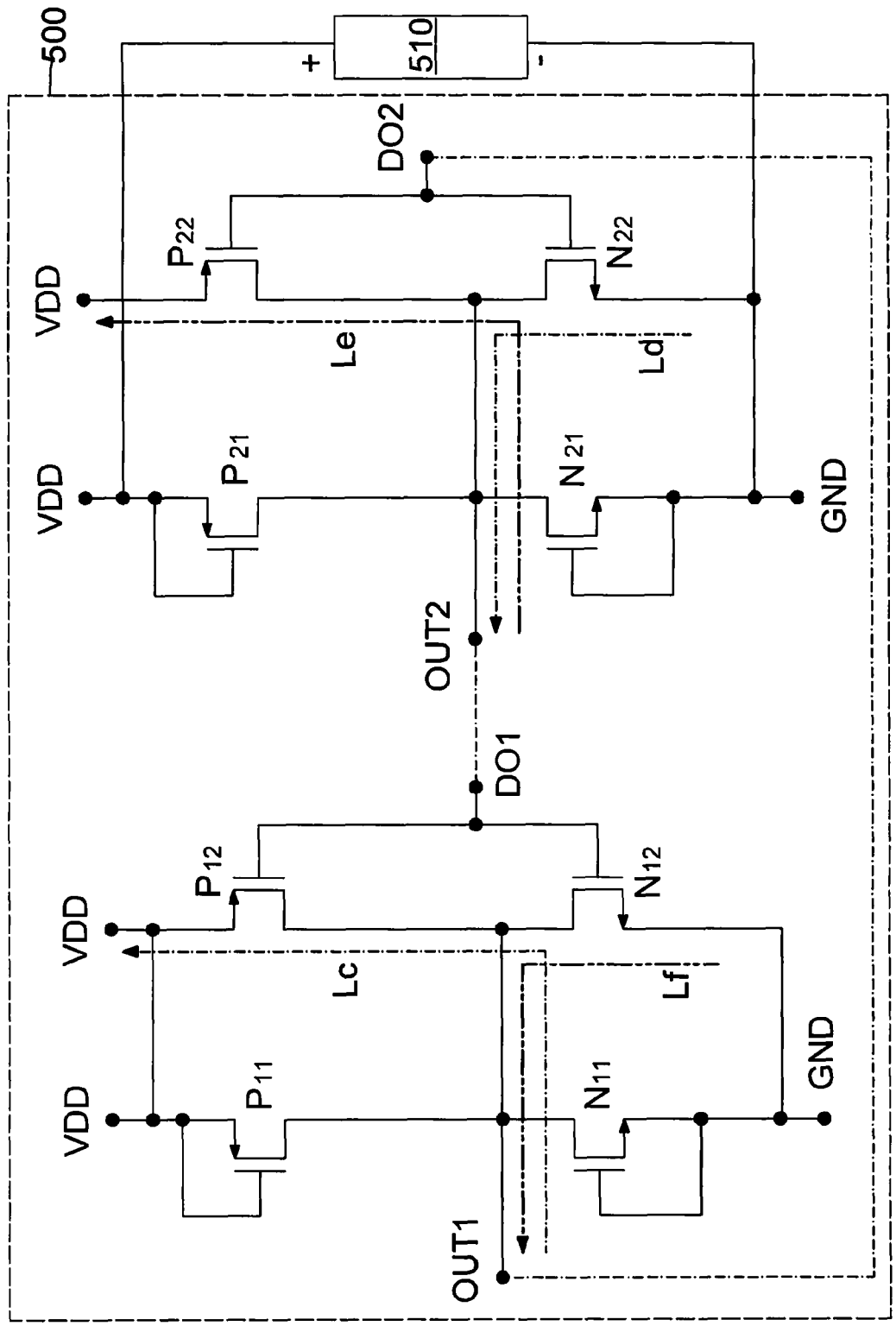
FIG. 5 is a circuit diagram of an embedded bridge rectifier according to a second embodiment of the invention.

FIG. 5 is a circuit diagram of an embedded bridge rectifier according to a second embodiment of the invention. Referring to FIG. 5, a first internal ESD protection circuit originally installed at an output bonding pad OUT1 includes the PMOS transistor $P_{11}$ and the NMOS transistor $N_{11}$ and a first internal output buffer originally installed at the output bonding pad OUT1 includes the PMOS transistor $P_{12}$ and the NMOS transistor $N_{12}$. A second internal ESD protection circuit originally installed at an output bonding pad OUT2 includes a PMOS transistor $P_{21}$ and a NMOS transistor $N_{21}$ and a second internal output buffer originally installed at the output bonding pad OUT2 includes a PMOS transistor $P_{22}$ and a NMOS transistor $N_{22}$. According to the invention, the two ESD protection circuits and the two output buffers originally installed at two output bonding pad OUT1 and OUT2 are reconfigured and reconnected. Consequently, an embedded bridge rectifier 500 of the invention is formed. Here, the gates of transistors $P_{12}$ and $N_{12}$ are connected at a node DO1 and simultaneously connected to the output bonding pad OUT2 (represented in dotted lines). The gates of transistors $P_{22}$ and $N_{22}$ are connected at a node DO2 and simultaneously connected to the output bonding pad OUT1 (represented in dotted lines). The operations of the embedded bridge rectifier 500 will be described in detail as follows.

Two input terminals (i.e., the output bonding pads OUT1 and OUT2) of the embedded bridge rectifier 500 receives an input AC signal, so the polarities of the voltages of the bonding pads OUT1 and OUT2 are reversed to each other. When the voltage at the bonding pad OUT1 is positive with respect to the voltage at the bonding pad OUT2, the transistor $P_{12}$ is turned on and the transistor $N_{12}$ is turned off since $V_{DO1}=V_{OUT2}=L$. In contrast, since $V_{OUT1}=V_{DO2}=H$, the transistor $P_{22}$ is turned off and the transistor $N_{22}$ is turned on; thus, the current will take the path of lower resistance, i.e., along the path Lc, through the load 510 and along the path Ld, without passing through the transistors $P_{12}$ and $N_{21}$ (with higher resistance). On the contrary, when the voltage of the bonding pad OUT1 is negative with respect to the voltage of the bonding pad OUT2, the transistor $P_{12}$ is turned off and the transistor $N_{12}$ is turned on since $V_{DO1}=V_{OUT2}=H$. In contrast, since $V_{OUT1}=V_{DO2}=L$, the transistor $P_{22}$ is turned on and the transistor $N_{22}$ is turned off; thus, the current will take the path of lower resistance, i.e., along the path Le, through the load 510 and along the path Lf, without passing through the transistors $P_{21}$ and $N_{11}$ (with higher resistance). As can be observed from the rectified current paths, although the polarities of the voltages of two input terminals of the embedded bridge rectifier 500 change, the polarities (VDD with respect to GND) of the two voltages of two output terminals remain constant.

Further, in each of the conventional bridge rectifier 100 and the embedded bridge rectifier 300, there is a voltage drop of around 2×Vt (around 2×0.6 V) in the output voltage swing at its output terminals. In the second embodiment, the current takes the path through the conducted MOS transistors ($P_{12}$ & $N_{22}$, or $P_{22}$ & $N_{12}$) rather than the path through the transistors ($P_{11}$, $N_{11}$, $P_{21}$, $N_{21}$) configured as diodes. Although there is a voltage drop of around 0.1 V across a conducted MOS transistor (the voltage drop is varied depending on the size of the MOS transistor), the output voltage swing at the output terminals of the embedded bridge rectifier 500 is much close to its input voltage swing.

Figure 6:
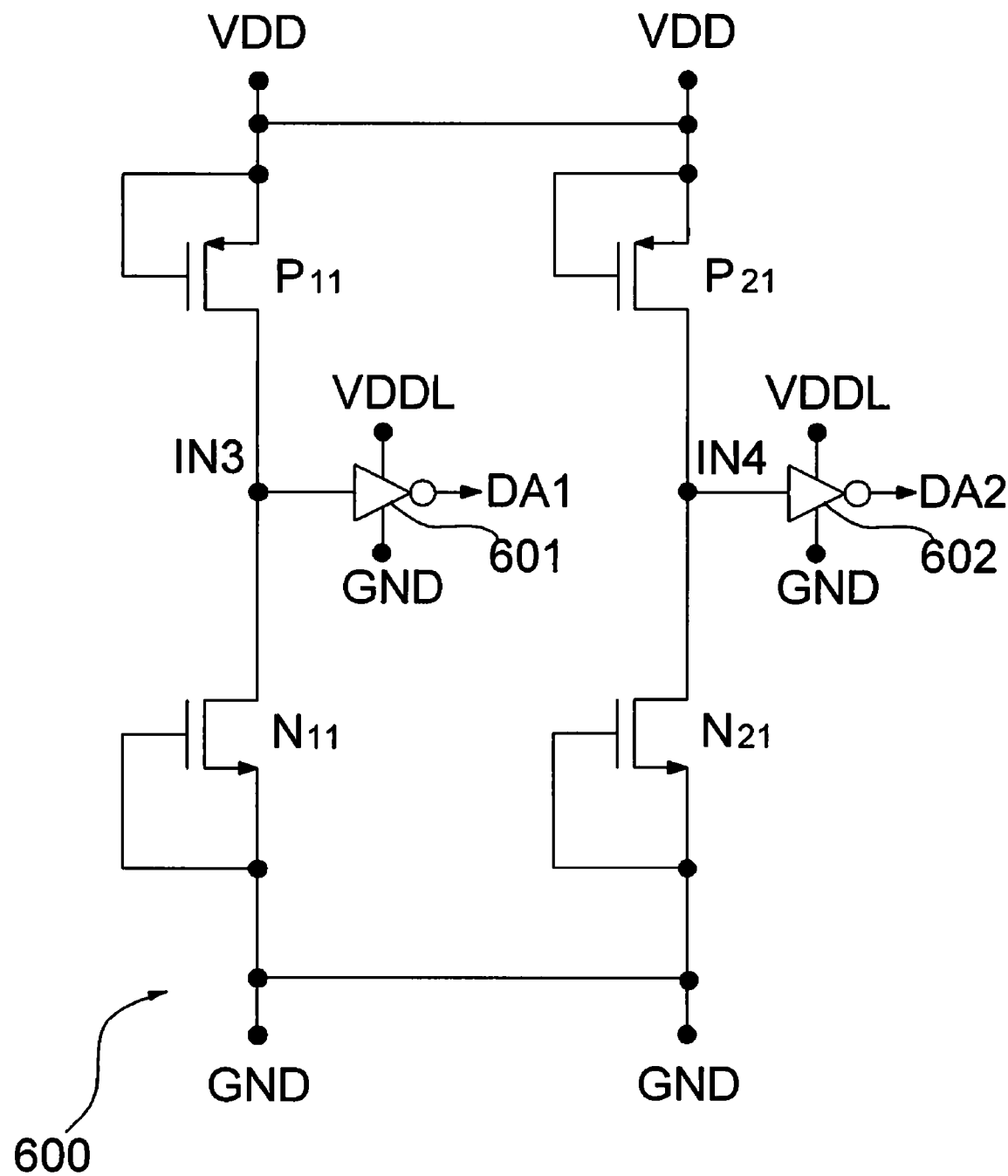
FIG. 6 is a circuit diagram of an embedded bridge rectifier according to a third embodiment of the invention.
Figure 7:
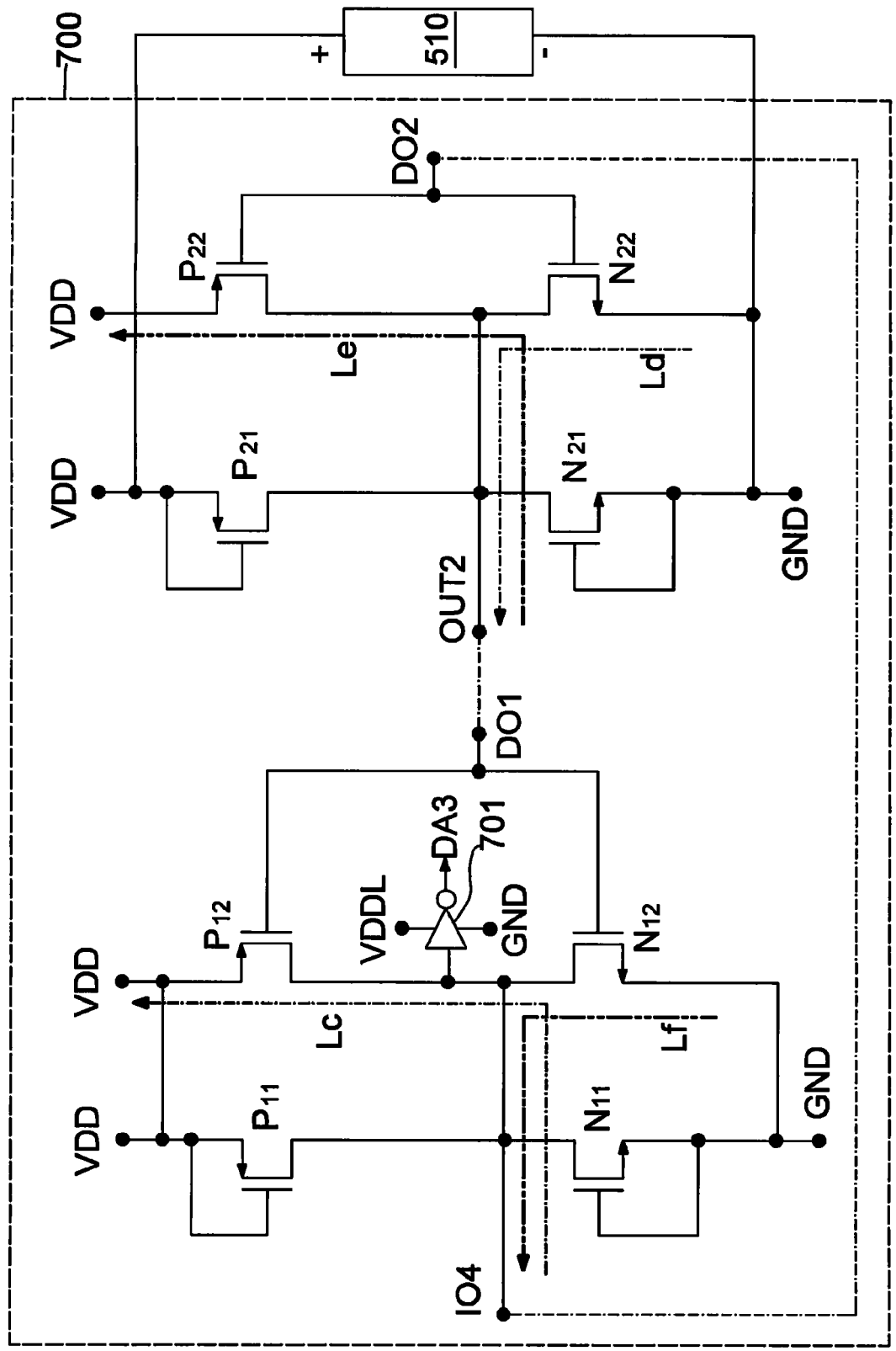
FIG. 7 is a circuit diagram of an embedded bridge rectifier according to a fourth embodiment of the invention.

On the other hand, the frequency of a normal AC signal is not necessarily constant. When an input AC signal is applied to two input terminals (the output bonding pads OUT1 and OUT2) of the embedded bridge rectifier 500, if the output DC signal (VDD with respect to GND) serves as a power supply, the frequency of the input AC signal will disappear. To solve this problem, an inverter or a level shifter is provided to connect with one of two input terminals of the embedded bridge rectifier 500 for obtaining an output AC signal which has the same frequency as the input AC signal but has a reversed polarity. The obtained output AC signal with the same frequency as the input AC signal will be supplied to the following stage circuit for demodulation. Instead, two inverters or two level shifters can be provided to connect with the two input terminals respectively. Then, depending on circuit applications, one or two output AC signal(s) of either the two inverters or the two level shifters can be used for demodulation. FIG. 6 is a circuit diagram of an embedded bridge rectifier according to a third embodiment of the invention. Comparing FIGS. 3 and 6, the differences are that the bonding pads IO1 and IO2 are replaced with input bonding pads IN1 and IN2 and their corresponding two input buffers 601 and 602 are configured as inverters. FIG. 7 is a circuit diagram of an embedded bridge rectifier according to a fourth embodiment of the invention. Comparing FIGS. 5 and 7, the differences are that the output bonding pad OUT1 is replaced with an input/output bonding pad IO4 and its corresponding input buffers 701 is configured as an inverter. The embedded bridge rectifier 700 is formed by reconfiguring and reconnecting two ESD protection circuits, an input buffer and two output buffers originally installed at an input/output bonding pad IO4 and the output bonding pad OUT2 respectively.

Referring to FIG. 6, since the rectified voltage VDD may directly or indirectly serve as a power supply, the rectified voltage VDD may be greater than or equal to the operating voltages VDDL of the inverters 601 and 602. For example, if with regulation, the output rectified voltage VDD will be reduced to the operating voltage VDDL by a regulator (not shown). Contrarily, if without regulation, the output rectified voltage VDD will be equal to the operating voltage VDDL. Besides, depending on circuit functional requirements, both or one of two output AC signals DA1 and DA2 of the inverters 601 and 602 can be supplied to the following stage circuit for demodulation. Referring to FIG. 7, only the output AC signal DA3 of the inverter 701 is supplied to the following stage circuit for demodulation. In summary, in each of the embedded bridge rectifiers 600 and 700, the correct frequency of the input AC signal (applied to the pads IN3, IN4 and IO4) is obtained and the voltage level of the output DC signal (VDD is reduced to VDDL) is able to be adjusted, thereby achieving signal rectification, frequency demodulation and voltage level adjustment.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An embedded bridge rectifier, applied to the interior of an integrated circuit, for receiving an input alternating current (AC) signal and generating an output direct current (DC) signal, comprising:
a first PMOS transistor, the gate and the source of the first PMOS transistor being shorted together;
a first NMOS transistor, the gate and the source of the first NMOS transistor being shorted together, wherein the drains of the first NMOS transistor and the first PMOS transistor are connected at a first pad of the integrated circuit;
a second PMOS transistor, the gate and the source of the second PMOS transistor being shorted together, wherein the sources of the first PMOS transistor and the second PMOS transistor are connected at a first output node of the integrated circuit; and
a second NMOS transistor, the gate and the source of the second NMOS transistor being shorted together, wherein the drains of the second NMOS transistor and the second PMOS transistor are connected at a second pad of the integrated circuit and the sources of the first NMOS transistor and the second NMOS transistor are connected at a second output node of the integrated circuit;
wherein the input AC signal is applied to the first pad and the second pad and the output DC signal is generated between the first output node and the second output node, and wherein the voltage of the first output node is greater than that of the second output node.

2. The embedded bridge rectifier according to claim 1, further comprising:
a first input buffer connected to the first pad, wherein the first input buffer is disabled if the first pad is an input pad.

3. The embedded bridge rectifier according to claim 1, further comprising:
a first input buffer connected to the first pad and configured as an inverter, wherein the output of the first input buffer is used to demodulate the input AC signal if the first pad is an input pad.

4. The embedded bridge rectifier according to claim 1, further comprising:
a first output buffer connected to the first pad, wherein the first output buffer is disabled if the first pad is an output pad.

5. The embedded bridge rectifier according to claim 1, further comprising:
a second input buffer connected to the second pad, wherein the second input buffer is disabled if the second pad is an input pad.

6. The embedded bridge rectifier according to claim 1, further comprising:
a second input buffer connected to the second pad and configured as an inverter, wherein the output of the second buffer is used to demodulate the input AC signal if the second pad is an input pad.

7. The embedded bridge rectifier according to claim 1, further comprising:
a second output buffer connected to the second pad, wherein the second output buffer is disabled if the second pad is an output pad.

8. The embedded bridge rectifier according to claim 1, wherein one of the voltages at the first pad and the second pad is greater than the voltage at the first output node.

9. The embedded bridge rectifier according to claim 1, wherein the first output node is not connected to any power supply.

10. The embedded bridge rectifier according to claim 1, wherein the polarities of the voltages of the first pad and the second pad are reversed to each other.

11. The embedded bridge rectifier according to claim 1, further comprising:
a third PMOS transistor, the source of the third PMOS transistor being connected with the first output node, the drain of the third PMOS transistor being connected with the first pad and the gate of the third PMOS transistor being connected with the second pad;
a third NMOS transistor, the source of the third NMOS transistor being connected with the second output node, the drain of the third NMOS transistor being connected with the first pad and the gate of the third NMOS transistor being connected with the second pad;
a fourth PMOS transistor, the source of the fourth PMOS transistor being connected with the first output node, the drain of the fourth PMOS transistor being connected with the second pad and the gate of the third PMOS transistor being connected with the first pad; and
a fourth NMOS transistor, the source of the fourth PMOS transistor being connected with the second output node, the drain of the fourth PMOS transistor being connected with the second pad and the gate of the third PMOS transistor being connected with the first pad.

12. The embedded bridge rectifier according to claim 11, further comprising:
a first input buffer connected to the first pad and configured as an inverter, wherein the output of the first input buffer is used to demodulate the input AC signal if the first pad is an input/output pad.

13. The embedded bridge rectifier according to claim 11, further comprising:
a second input buffer connected to the second pad and configured as an inverter, wherein the output of the second input buffer is used to demodulate the input AC signal if the second pad is an input/output pad.

14. The embedded bridge rectifier according to claim 11, further comprising:
a first input buffer connected to the first pad, wherein the first input buffer is disabled if the first pad is an input/output pad.

15. The embedded bridge rectifier according to claim 11, further comprising:
a second input buffer connected to the second pad, wherein the second input buffer is disabled if the second pad is an input/output pad.

16. The embedded bridge rectifier according to claim 1, wherein the first pad is further connected to an input terminal of a first level shifter and wherein the output of the first level shifter is used to demodulate the input AC signal.

17. The embedded bridge rectifier according to claim 1, wherein the second pad is further connected to an input terminal of a second level shifter and wherein the output of the second level shifter is used to demodulate the input AC signal.

18. The embedded bridge rectifier according to claim 1, wherein the first PMOS transistor and the first NMOS transistor are originally installed at the first bonding pad and serve as a first ESD protection circuit, and wherein the second PMOS transistor and the second NMOS transistor are originally installed at the second bonding pad and serve as a second ESD protection circuit with respect to the integrated circuit.

* * * * *